United States Patent [19]

Propst et al.

[11] Patent Number: 5,365,345
[45] Date of Patent: Nov. 15, 1994

[54] INFRARED TRANSMITTING WINDOW AND METHOD OF MAKING SAME

[75] Inventors: Stephen H. Propst; Geoffrey A. Walter, both of Santa Ynez, Calif.

[73] Assignee: Santa Barbara Research Center, Goleta, Calif.

[21] Appl. No.: 683,765

[22] Filed: Apr. 10, 1991

[51] Int. Cl.⁵ .............................. G02B 5/22
[52] U.S. Cl. ........................... 359/359; 264/56
[58] Field of Search ............. 350/1.6; 264/56; 359/359

[56] References Cited

U.S. PATENT DOCUMENTS 4,907,846  3/1990  Tustison et al. ......... 428/908.8 X
5,007,689  4/1991  Kelly et al. ............... 350/1.6
5,120,602  6/1992  Tustison et al. ........... 428/697 X

*Primary Examiner*—Peter A. Nelson
*Attorney, Agent, or Firm*—W. C. Schubert; W. K. Denson-Low

[57] ABSTRACT

Infrared transmitting windows having a diamond support are formed by first depositing diamond (14) on a mold (10) comprising a material which can withstand the optimum diamond growth temperatures. A germanium carbide adhesive layer (18) is deposited on the diamond layer Next, ZnSe, ZnS, or other index-matching material (16) is deposited on top of the diamond coating. Finally, the mold is removed. The end product is a diamond/ZnS(e) IR window requiring little or no polishing of diamond surfaces.

21 Claims, 2 Drawing Sheets

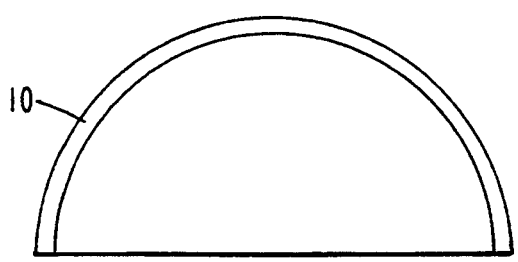
Fig. 2a.
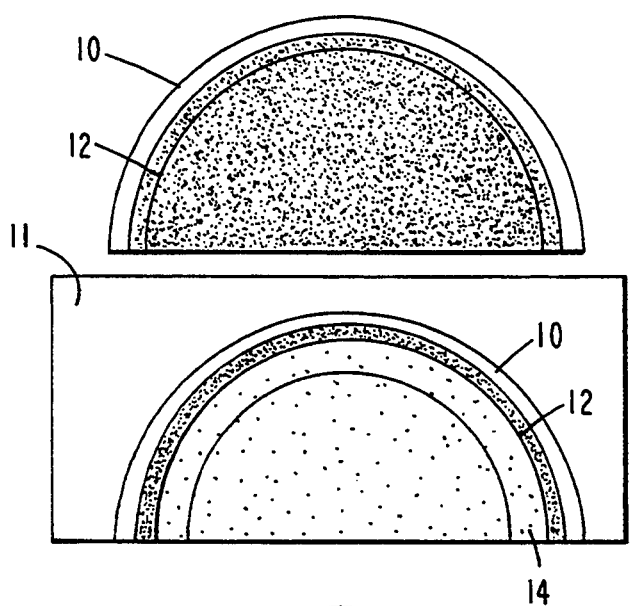
Fig. 2b.
Fig. 2c.
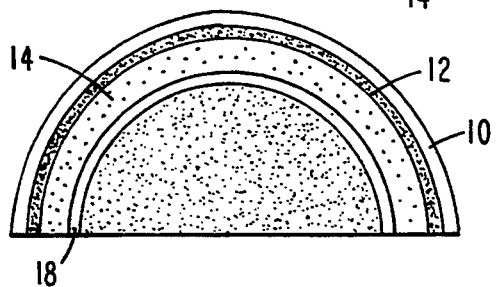
Fig. 2d.
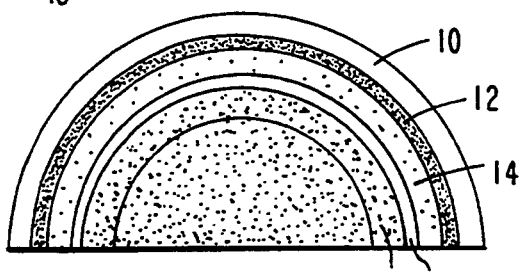
Fig. 2e.
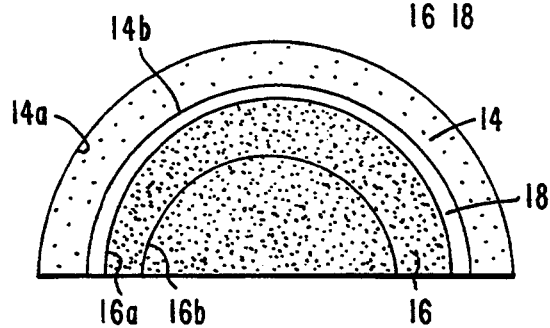
Fig. 2f.

INFRARED TRANSMITTING WINDOW AND METHOD OF MAKING SAME

BACKGROUND OF THE INVENTION

1. Field of the Invention

The present invention relates to optical materials transparent in the infrared (IR) region, and, more particularly, to diamond/zinc selenide (or zinc sulfide) windows.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

2. Description of Related Art

Diamond has many uses. One particular use is directed to hard, optically transparent windows. In such applications, diamond is used as a coating to provide hardness to the window for protection, for ultra-high speeds or poor environmental conditions, such as rain.

Historically, diamond-like carbon (DLC) and polycrystalline diamond coatings have been deposited on IR window materials such as germanium and germanium-coated zinc selenide or zinc sulfide to improve the hardness thereof.

Processes for depositing true diamond films are rapidly improving. Diamond has several advantages over DLC films, including greater hardness and a near-absence of the stress which limits the thickness of the DLC films. However, one process limitation, which must be overcome, is that high-quality diamond requires deposition temperatures of at least 650° C. It has been observed that at temperatures above 250° C., sulfur/selenium is removed from the ZnS/ZnSe substrate with a resulting decrease of internal transmittance. Additionally, the thermal coefficients of expansion for zinc salts and diamond vary by an order of magnitude. Therefore, the issue of substrate temperature is central to diamond coating of zinc salt domes.

Accordingly, there is a need in the art for an improved process for providing improved IR windows having a diamond support.

SUMMARY OF THE INVENTION

In accordance with the invention, a deposition process is provided for forming IR windows having a diamond support. In a most general sense, the invention includes the steps of (a) providing a mold having an surface; (b) depositing a diamond layer on the surface; (c) depositing an adhesive layer comprising germanium carbide on the diamond layer; and (d) depositing a zinc salt layer selected from the group consisting of zinc selenide and zinc sulfide on the adhesive layer.

In a specific embodiment, the diamond is first deposited on a mold comprising a material which can withstand the optimum diamond growth temperatures. Next, ZnSe, ZnS, or other index-matching material is deposited on top of the diamond coating. Finally, the mold is removed. The end product is a diamond/ZnS(e) IR window requiring little or no polishing of diamond surfaces.

BRIEF DESCRIPTION OF THE DRAWINGS

FIGS. 2a–f depict the sequence of operations in forming the dome of the invention (FIG. 1 shows the completed dome plus mold and housing still intact).

DESCRIPTION OF THE PREFERRED EMBODIMENTS

In the process of the invention, a diamond film is deposited on the concave inner surface of another material chosen for use as a preform mold. The ZnSe or ZnS (ZnS(e)) is then deposited on top of the diamond film. This process of depositing ZnS(e) on diamond eliminates any chance of thermal degradation of the ZnSe or ZnS and the problems associated with thermal expansion mismatch by depositing diamond on ZnSe or ZnS, which requires a higher deposition temperature. The process of the invention provides a polished diamond outer dome surface as grown, since the outer dome surface is formed on the concave inner surface of the mold, which is quite smooth.

Figure 1:
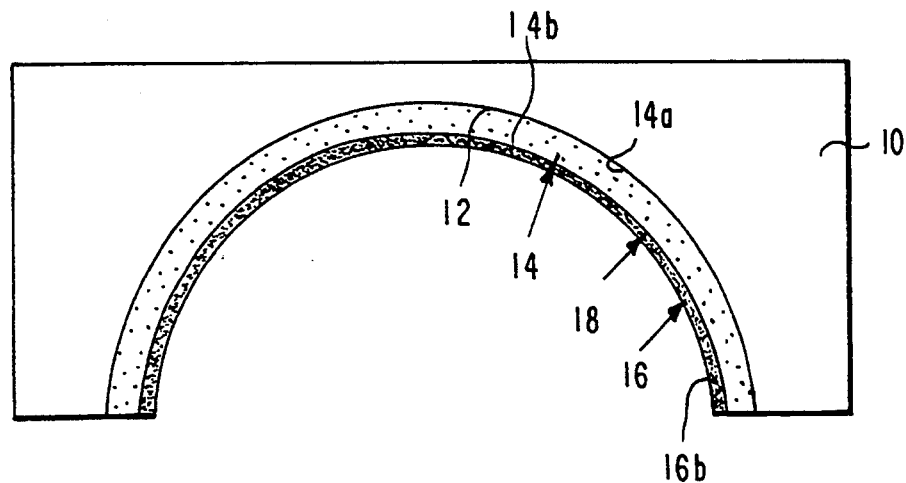
FIG. 1 is a cross-sectional view of the layers of films formed in a mold in accordance with the process of the invention.

Referring now to FIGS. 1 and 2, a polished preform dome mold 10, preferably provided with a water-cooled housing 11 (FIG. 2c), is first coated with a diamond-like carbon (DLC) film 12. The polished preform 10 may comprise any material which can withstand diamond growth temperatures on the order of 1,000° C. Examples include graphite, molybdenum, silicon, and silicon carbide.

Use of graphite permits use of sandblasting to remove the mold, rather than acid etching, which is required for other materials. Sandblasting stops automatically at diamond. Accordingly, polished graphite is preferred.

Graphite available from Poco Graphite, Inc., a division of UNOCAL, is especially preferred, due to its purity, lattice match, and good thermal conductivity.

The DLC film 12 is optionally deposited. If used, it provides a nucleation site for diamond growth. The DLC film 12 is amorphous and is grown to a thickness of about 1,000 to 2,000 Å using plasma chemical vapor deposition (CVD). Hexane is used as the carbon source, employing a planar diode, with the mold as the cathode. Growth of the DLC film 12 is carried out at ambient temperatures.

The highly polished custom graphite dome 10 is used as the mold, the thin layer 12 of DLC is deposited on the dome, and then the dome is placed in the water-cooled housing 11. Alternatively, the mold 10 and the water-cooled housing 11 may be integral, with the thin layer 12 of DLC then deposited on the concave surface of the dome.

Then, using a plasma-jet process capable of depositing diamond at a rate of about 200 μm per hour, a diamond dome 14 is grown. A DC plasma jet is used, with a tungsten anode, and an arc is formed from the anode to the cathode, both within the plasma torch. A gas mixture of hydrogen and methane is then passed between the anode and cathode which ionizes the gases. The gas flow rate is about 10 to 50 l/min of $H_2$ and 0.05 to 2 l/min of $CH_4$. The process is carried out at a pressure of about 200 Torr, with the substrate temperature typically about 700° to 1,000° C. Diamond films on the order of 1 to 2 mm may be grown in about 5 to 10 hours.

This is to be contrasted with other processes, such as microwave plasma and hot filament plasma, which only provide a growth rate of 2 to 3 μm/hr; such processes are not suitably employed in the practice of the invention, due to the long times required to grow the diamond layer 14.

The outer diamond surface 14a is exposed after removing the preform 10, such as by mechanical etching (e.g., sandblasting) and after removing the DLC layer 12 using oxygen plasma etching. This outer surface 14a is polished as grown, since the concave surface of the mold has been highly polished prior to the formation of the diamond layer 14 thereon. Indeed, the outer surface 14a may be mirror-like, featureless under 400X optical power. The inner diamond surface 14b will, however, have polycrystalline facets on the order of about 1 to 5 μm grain size.

Rather than attempt to polish this interior diamond surface 14b, a film 16 of ZnSe or ZnS is deposited by CVD over the diamond film 14. A thin germanium carbide (Ge:C) adhesive layer 18 is first deposited prior to depositing the ZnSe or ZnS film 16, however. The adhesive layer 18 is deposited to a thickness of about 100 Å; the carbon in the film adheres to the diamond film 14, while the ZnSe or ZnS film 16 adheres to the germanium. The thickness is sufficient to provide the adhesive function without adversely affecting the transmittance of the window.

The amount of carbon in the Ge:C film 18 ranges from about 10 to 70% in order to render the electrical, optical, and mechanical properties of Ge intermediate those of diamond and Ge, since Ge has a significant free-carrier absorption above 50° C. and a large index of refraction ($\approx 4.0$) relative to both ZnSe and diamond.

The surface roughness of the interior diamond surface 14b is actually beneficial in aiding in providing an improved bond between the diamond and the ZnS(e) layers. The notation "ZnS(e)" is intended as a shorthand expression of both ZnSe and ZnS, either of which is next deposited.

The ZnS(e) layer 16 is deposited at a temperature of about 400° to 700° C., but due to the desire to match the thermal coefficients of expansion as close as possible, the lower temperatures are preferred.

Figure 3:
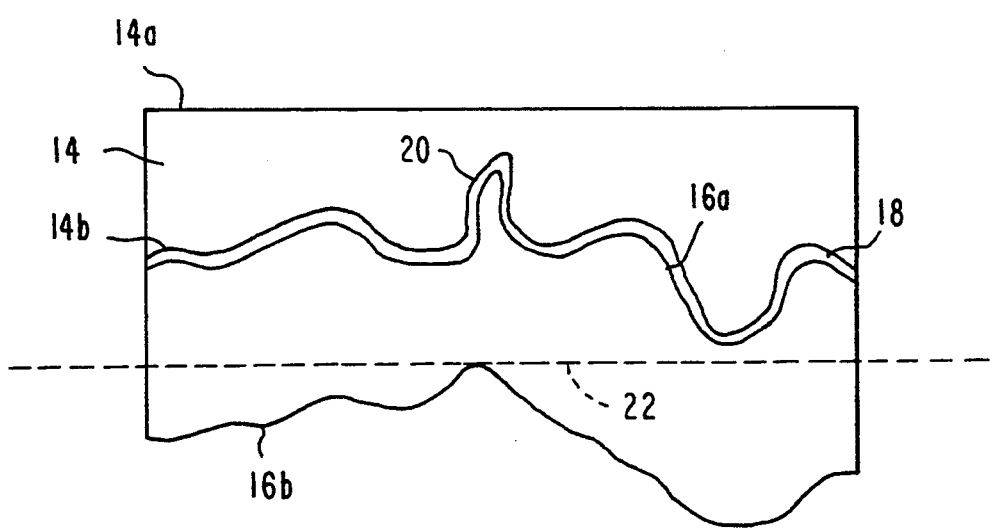
FIG. 3 is an enlargement, showing pores of diamond filled with ZnSe (or ZnS) and planarized.

The ZnS(e) layer 16 is deposited to a thickness ranging from about 10 μm to 0.25 inch. A thickness of at least about 10 μm is sufficient to fill in the rough diamond morphology, shown in FIG. 3; there, pores 20 in the diamond layer 14 are shown filled with the ZnS(e) layer 16. A somewhat greater thickness permits planarization of the ZnS(e) layer; planarization is shown by dotted line 22. Planarization techniques are known and do not form a part of this invention.

Because the index of refraction of ZnS(e) and diamond can be made to match precisely, the faceted interface between these two materials provided by surfaces 14b, 16a will not be optically visible.

Where layer 16 comprises ZnSe, this material may be optionally hardened by well known hardening processes, such as by adding 1% S to the ZnSe film during CVD growth.

The interior surface 16b of the ZnS(e) film 16 is lapped and polished following deposition. Since this material is considerably softer than diamond, polishing is easily done using grit and proceeding to finer and finer polishes down to rouge, resulting in planarized surface 22.

The approach of depositing diamond on a concave preform, such as of graphite, eliminates the surface irregularities on surface 14a which would result if diamond were deposited in the traditional fashion on the outer surface of a ZnSe or ZnS dome. These surface irregularities would result from the diamond film's polycrystalline structure. Depositing DLC over a pre-polished mold, and then depositing diamond, ensures a smooth outer dome surface, without requiring polishing of diamond.

Thus, there has been disclosed an infrared transparent window and a process for fabricating the same. It will be apparent to those of ordinary skill in this art that changes and modifications of an obvious nature may be made without departing from the spirit and scope of the invention, and all such changes and modifications are considered to fall within the ambit of the invention, as defined by the appended claims.

Accordingly,

What is claimed is:

1. A process for fabricating an infrared transparent window including the steps of:
    (a) providing a mold having a surface;
    (b) depositing a diamond layer on said surface;
    (c) depositing an adhesive layer comprising germanium carbide on said diamond layer; and
    (d) depositing a zinc salt layer selected from the group consisting of zinc selenide and zinc sulfide on said adhesive layer.

2. The process of claim 1 wherein a diamond-like carbon layer is deposited on said mold surface prior to deposition of said diamond layer.

3. The process of claim 2 wherein said diamond-like carbon layer is deposited to a thickness ranging from about 1,000 to 2,000 Å.

4. The process of claim 1 wherein said mold surface is the inner surface thereof and said mold surface is concave.

5. The process of claim 1 wherein said mold material consists essentially of a material capable of withstanding at least about 1,000° C.

6. The process of claim 5 wherein said mold material consists essentially of a material selected from the group consisting of graphite, molybdenum, silicon, and silicon carbide.

7. The process of claim 1 wherein said diamond layer is grown by DC plasma jet, employing a mixture of hydrogen and methane gases.

8. The process of claim 7 wherein said hydrogen has a gas flow rate ranging from about 10 to 50 l/min and wherein said methane has a gas flow rate ranging from about 0.05 to 2 l/min and wherein said surface is heated to a temperature ranging from about 700° to 1,000° C. to provide a growth rate of about 200 μm per hour.

9. The process of claim 8 wherein said diamond layer is grown to a thickness of about 1 to 2 mm.

10. The process of claim 1 wherein said germanium carbide adhesive layer is grown to a thickness of about 100 Å.

11. The process of claim 1 wherein said germanium carbide layer contains about 10 to 70% carbon.

12. The process of claim 1 wherein said zinc salt layer is grown by chemical vapor deposition at a temperature ranging from about 400° to 700° C. to a thickness ranging from about 10 μm to 0.25 inch.

13. The process of claim 1 wherein said zinc salt layer consists essentially of hardened zinc selenide.

14. The process of claim 1 wherein said mold is subsequently removed from said diamond layer.

15. The process of claim 14 wherein said mold consists essentially of graphite, which is removed by sandblasting.

16. The process of claim 1 wherein the surface of said zinc salt is polished.

17. An infrared transmitting window comprising a diamond layer (14) having a mirror-like outer convex surface (14a) and a faceted inner concave surface (14b), an adhesive layer (18) consisting essentially of germanium carbide on said inner concave surface, and a zinc salt layer (16) on said adhesive layer, said zinc salt selected from the group consisting of zinc selenide and zinc sulfide.

18. The infrared transmitting window of claim 17 wherein said diamond layer (14) ranges in thickness from about 1 to 2 mm.

19. The infrared transmitting window of claim 17 wherein said adhesive layer (18) is about 100 Å thick.

20. The infrared transmitting window of claim 17 wherein said germanium carbide layer (18) contains about 10 to 70% carbon.

21. The infrared transmitting window of claim 17 wherein said zinc salt layer (16) ranges in thickness from about 10 $\mu$m to 0.25 inch.

* * * * *